US012693342B2

(12) United States Patent
Zhao et al.

(10) Patent No.: US 12,693,342 B2
(45) Date of Patent: Jul. 28, 2026

(54) METHOD AND DEVICE FOR CALIBRATING SOC AT TAIL END OF CHARGING OR DISCHARGING OF ENERGY STORAGE SYSTEM

(71) Applicant: Sungrow Power Supply Co., Ltd., Hefei (CN)

(72) Inventors: Yunfei Zhao, Hefei (CN); Qing Li, Hefei (CN); Junwei Shao, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 416 days.

(21) Appl. No.: 18/354,199

(22) Filed: Jul. 18, 2023

(65) Prior Publication Data

US 2024/0159836 A1     May 16, 2024

(30) Foreign Application Priority Data

Nov. 15, 2022     (CN) .......................... 202211432343.6

(51) Int. Cl.
    *G01R 31/3842*     (2019.01)
    *G01R 31/367*      (2019.01)
    *H02J 7/82*        (2026.01)

(52) U.S. Cl.
    CPC ....... *G01R 31/3842* (2019.01); *G01R 31/367* (2019.01); *H02J 7/82* (2026.01)

(58) Field of Classification Search
    CPC .. G01R 31/3842; G01R 31/367; H02J 7/0048
    See application file for complete search history.

(56) References Cited

U.S. PATENT DOCUMENTS 9,188,649  B2    11/2015  Chen et al.
9,797,960  B2    10/2017  Barrett et al.
2002/0113595 A1   8/2002  Sakai et al.
                 (Continued)

FOREIGN PATENT DOCUMENTS

AU        2023208067           3/2024
CN        103884990 A    *    6/2014
                 (Continued)

OTHER PUBLICATIONS

Brylski "State of Charge Estimation Using Smart Battery Charger" (2022) (https://www.ti.com/lit/an/sluaaa1/sluaaa1.pdf?ts= 1761660762212&ref_url=https%253A%252F%252Fwww.google. com%252F) (Year: 2022).*

(Continued)

*Primary Examiner* — Sujay Koneru
(74) *Attorney, Agent, or Firm* — Wolf, Greenfield & Sacks, P.C.

(57)          ABSTRACT

A method and a device for calibrating an SOC at tail end of charging or discharging of an energy storage system are provided. An SOC and a voltage of a battery unit are acquired in real time during charging or discharging of the battery unit. Whether the battery unit meets an SOC calibration condition is determined by comparing the SOC of the battery unit with a pre-calibrated calibration SOC at the tail end of charging/discharge and comparing the voltage of the battery unit with a calibration voltage, so that the SOC of the battery unit is timely calibrated if the SOC calibration condition is met.

12 Claims, 3 Drawing Sheets

(56)  References Cited

U.S. PATENT DOCUMENTS

| | | | | |
|---|---|---|---|---|
| 2005/0134282 A1* | 6/2005 | Averbuch | ........... | G01R 31/3842 |
| | | | | 324/426 |
| 2009/0027056 A1* | 1/2009 | Huang | ................ | G01R 31/392 |
| | | | | 320/132 |
| 2010/0121591 A1* | 5/2010 | Hall | ..................... | G01R 31/367 |
| | | | | 702/63 |
| 2011/0226559 A1* | 9/2011 | Chen | ................... | G01R 31/367 |
| | | | | 187/290 |
| 2012/0065824 A1 | 3/2012 | Takahashi et al. | | |
| 2013/0085696 A1* | 4/2013 | Xu | ........................... | B60L 58/16 |
| | | | | 702/63 |
| 2013/0103332 A1 | 4/2013 | Chen et al. | | |
| 2013/0335036 A1* | 12/2013 | Zhang | ...................... | H02J 7/52 |
| | | | | 320/162 |
| 2014/0172333 A1 | 6/2014 | Gopalakrishnan et al. | | |
| 2014/0316728 A1* | 10/2014 | Zhong | ................. | G01R 31/374 |
| | | | | 702/63 |
| 2015/0231986 A1* | 8/2015 | Li | ........................... | B60L 58/13 |
| | | | | 903/903 |
| 2015/0355615 A1* | 12/2015 | Lee | ........................ | B60L 50/52 |
| | | | | 700/275 |
| 2016/0018469 A1* | 1/2016 | Ho | ....................... | G01R 31/367 |
| | | | | 702/63 |
| 2017/0371000 A1 | 12/2017 | Fukushima et al. | | |
| 2020/0257312 A1* | 8/2020 | Suzuki | .................... | G08G 1/22 |
| 2021/0141028 A1 | 5/2021 | Du et al. | | |
| 2022/0082630 A1* | 3/2022 | Takaoka | ............. | G01R 31/3842 |
| 2022/0120815 A1* | 4/2022 | Wei | ................... | G01R 31/3648 |
| 2022/0169230 A1* | 6/2022 | Brunet | .................. | B60W 10/06 |
| 2022/0326308 A1* | 10/2022 | Chen | ................... | H02J 7/00047 |
| 2022/0407338 A1* | 12/2022 | Li | ......................... | H02J 7/927 |
| 2025/0070395 A1* | 2/2025 | Cao | ..................... | H01M 50/461 |

FOREIGN PATENT DOCUMENTS

| | | |
|---|---|---|
| CN | 112147513 A | 12/2020 |
| CN | 112305432 A | 2/2021 |
| CN | 113933711 A | 1/2022 |
| CN | 114384431 A | 4/2022 |
| CN | 115015763 A | 9/2022 |
| CN | 115061045 A | 9/2022 |
| CN | 115079026 A | 9/2022 |
| DE | 102013214292 B4 | 12/2018 |
| DE | 102020130732 A1 | 5/2022 |
| EP | 3 742 181 A1 | 11/2020 |
| EP | 3 783 377 A1 | 2/2021 |
| EP | 23186836.5 | 4/2024 |
| GB | 2 582 347 A | 9/2020 |
| WO | WO 2020/216082 A1 | 10/2020 |

OTHER PUBLICATIONS

Extended European Search Report for European Application No. 23186836.5, dated Apr. 24, 2024.
First Examination Report for Australian Patent Application No. 2023208067, dated Mar. 21, 2024.
First Office Action for Chinese Application No. 202211432343.6, dated Aug. 23, 2025.

* cited by examiner

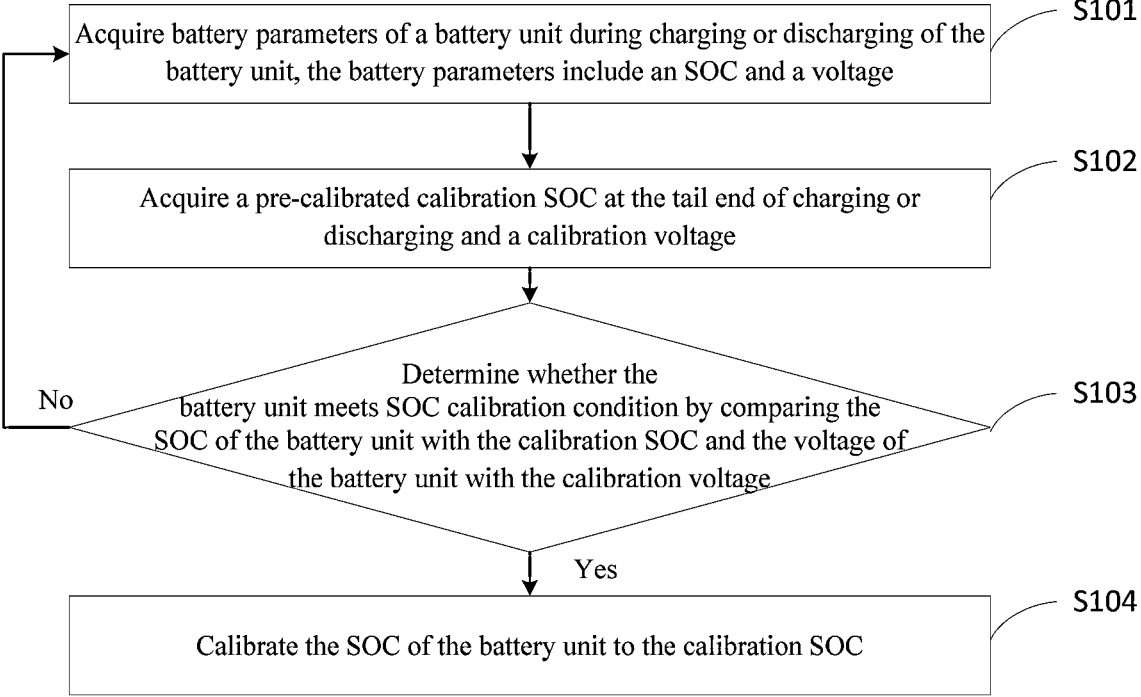

S101

Acquire battery parameters of a battery unit during charging or discharging of the battery unit, the battery parameters include an SOC and a voltage

S102

Acquire a pre-calibrated calibration SOC at the tail end of charging or discharging and a calibration voltage

S103

No

Determine whether the battery unit meets SOC calibration condition by comparing the SOC of the battery unit with the calibration SOC and the voltage of the battery unit with the calibration voltage Yes

S104

Calibrate the SOC of the battery unit to the calibration SOC

Fig. 1

METHOD AND DEVICE FOR CALIBRATING SOC AT TAIL END OF CHARGING OR DISCHARGING OF ENERGY STORAGE SYSTEM

The present application claims priority to Chinese Patent Application No. 202211432343.6, titled "method and device for calibrating SOC at tail end of charging or discharging of energy storage system", filed on Nov. 15, 2022 with the China National Intellectual Property Administration, which is incorporated herein by reference in its entirety.

FIELD

The present application relates to the technical field of battery technology, and in particular to a method and device for calibrating an SOC at tail end of charging or discharging of energy storage system.

BACKGROUND

A battery management system is an important part of an energy storage system. Main functions of the battery management system include data collection, state estimation, charging and discharging control, battery energy equalization, and so on. Battery parameter collection and the state estimation provide important parameters for the battery management system. A State of Charge (SOC) is one of core parameters of a battery. Whether an SOC can be acquired in a timely and accurate manner is crucial to improving life and safety of the battery.

As an internal parameter of the battery, the SOC cannot be directly measured, and can only be estimated through various estimation methods. At present, the SOC is usually estimated by combining the ampere-hour integration method and the open-circuit voltage method. However, this SOC estimation method has certain error, and as the energy storage system continues to operate for a long time, the error between the estimated SOC and the actual SOC becomes increasingly large. Especially, the SOC is directly calibrated to 100% when the energy storage system is fully charged, and the SOC is directly calibrated to 0% when the energy storage system is fully discharged. If the error between the estimated SOC displayed by a meter and the actual SOC is large at this time, the SOC displayed by the meter may directly jump to 100% or 0%, which affects user experience.

SUMMARY

A method and a device for calibrating an SOC at tail end of charging or discharging of energy storage system are provided according to the present application, which improves the accuracy of the SOC of the battery unit, avoids an SOC jump caused by a large difference between the SOC of the battery unit and the actual SOC at the tail end of charging or discharging, and effectively improves user experience.

A method for calibrating an SOC at tail end of charging or discharging of energy storage system includes:

acquiring battery parameters of a battery unit during charging or discharging of the battery unit, wherein the battery parameters comprise an SOC and a voltage;

acquiring a pre-calibrated calibration SOC at the tail end of charging or discharging and a calibration voltage;

determining whether the battery unit meets an SOC calibration condition, by comparing the SOC of the battery unit with the calibration SOC and comparing the voltage of the battery unit with the calibration voltage; and calibrating the SOC of the battery unit to the calibration SOC, in responding to determining that the battery unit meets the SOC calibration condition.

In an embodiment, acquiring the pre-calibrated calibration SOC at the tail end of charging or discharging and the calibration voltage includes:

selecting the calibration SOC corresponding to a charging or discharging state of the battery unit, and a voltage and a current that are corresponding to the calibration SOC, from a pre-determined battery voltage curve under a standard operating condition;

calibrating the voltage corresponding to the calibration SOC, based on a current of the battery unit, an internal resistance of the battery unit, and the current corresponding to the calibration SOC, to obtain the calibration voltage.

In an embodiment, determining whether the battery unit meets the SOC calibration condition during charging of the battery unit includes:

determining whether the SOC of the battery unit is less than a sum of the calibration SOC and a charge calibration return difference threshold, wherein the charge calibration return difference threshold is a negative value;

determining that the battery unit does not meet the SOC calibration condition, in response to the SOC of the battery unit being not less than the sum of the calibration SOC and the charge calibration return difference threshold;

determining whether the voltage of the battery unit is greater than the calibration voltage, in response to the SOC of the battery unit being less than the sum of the calibration SOC and the charge calibration return difference threshold;

determining that the battery unit does not meet the SOC calibration condition, in response to the voltage of the battery unit being not greater than the calibration voltage;

determining that the battery unit meets the SOC calibration condition, in response to the voltage of the battery unit being greater than the calibration voltage.

In an embodiment, the voltage of the battery unit is a highest voltage of voltages of cells in the battery unit during charging of the battery unit.

In an embodiment, determining whether the battery unit meets the SOC calibration condition during discharging of the battery unit includes:

determining whether the SOC of the battery unit is greater than a sum of the calibration SOC and a discharge calibration return difference threshold, wherein the discharge calibration return difference threshold is a positive value;

determining that the battery unit does not meet the SOC calibration condition, in response to the SOC of the battery unit being not greater than the sum of the calibration SOC and the discharge calibration return difference threshold;

determining whether the voltage of the battery unit is less than the calibration voltage, in response to the SOC of the battery unit being greater than the sum of the calibration SOC and the discharge calibration return difference threshold;

determining that the battery unit does not meet the SOC calibration condition, in response to the voltage of the battery unit being not less than the calibration voltage;

determining that the battery unit meets the SOC calibration condition, in response to the voltage of the battery unit being less than the calibration voltage.

In an embodiment, the voltage of the battery unit is a lowest voltage of voltages of cells in the battery unit during discharging of the battery unit.

A device for calibrating an SOC at a tail end of charging or discharging of an energy storage system includes:

a battery parameter acquisition unit, configured to acquire battery parameters of a battery unit during charging or discharging of the battery unit, wherein the battery parameters comprise an SOC and a voltage;

a calibration parameter acquisition unit, configured to acquire a pre-calibrated calibration SOC at the tail end of charging or discharging and a calibration voltage;

a calibration determination unit, configured to determine whether the battery unit meets an SOC calibration condition by comparing the SOC of the battery unit with the calibration SOC and comparing the voltage of the battery unit with the calibration voltage; and an SOC calibration unit, configured to calibrating the SOC of the battery unit to the calibration SOC in responding to determining that the battery unit meets the SOC calibration condition.

In an embodiment, the calibration parameter acquisition unit is configured to:

select the calibration SOC corresponding to a charging or discharging state of the battery unit, and a voltage and a current that are corresponding to the calibration SOC, from a pre-determined battery voltage curve under a standard operating condition;

calibrate the voltage corresponding to the calibration SOC based on a current of the battery unit, an internal resistance of the battery unit, and the current corresponding to the calibration SOC, to obtain the calibration voltage.

In an embodiment, during charging of the battery unit, the calibration determination unit is configured to:

determine whether the SOC of the battery unit is less than a sum of the calibration SOC and a charge calibration return difference threshold, wherein the charge calibration return difference threshold is a negative value;

determine that the battery unit does not meet the SOC calibration condition, in response to the SOC of the battery unit being not less than the sum of the calibration SOC and the charge calibration return difference threshold;

determine whether the voltage of the battery unit is greater than the calibration voltage, in response to the SOC of the battery unit being less than the sum of the calibration SOC and the charge calibration return difference threshold;

determine that the battery unit does not meet the SOC calibration condition, in response to the voltage of the battery unit being not greater than the calibration voltage;

determine that the battery unit meets the SOC calibration condition, in response to the voltage of the battery unit being greater than the calibration voltage.

In an embodiment, the voltage of the battery unit is a highest voltage of voltages of cells in the battery unit during charging of the battery unit.

In an embodiment, during discharging of the battery unit, the calibration determination unit is configured to:

determine whether the SOC of the battery unit is greater than a sum of the calibration SOC and a discharge calibration return difference threshold, wherein the discharge calibration return difference threshold is a positive value;

determine that the battery unit does not meet the SOC calibration condition, in response to the SOC of the battery unit being not greater than the sum of the calibration SOC and the discharge calibration return difference threshold;

determine whether the voltage of the battery unit is less than the calibration voltage, in response to the SOC of the battery unit being greater than the sum of the calibration SOC and the discharge calibration return difference threshold;

determine that the battery unit does not meet the SOC calibration condition, in response to the voltage of the battery unit being not less than the calibration voltage;

determine that the battery unit meets the SOC calibration condition, in response to the voltage of the battery unit being less than the calibration voltage.

In an embodiment, the voltage of the battery unit is a lowest voltage of voltages of cells in the battery unit during discharging of the battery unit.

A method and a device for calibrating an SOC at a tail end of charging or discharging of an energy storage system are disclosed by the present application. During charging or discharging of the battery unit, the SOC and the voltage of the battery unit are acquired in real time. Whether the battery unit meets the SOC calibration condition is determined by comparing the SOC of the battery unit with the pre-calibrated calibration SOC at the tail end of charging or discharging and comparing the voltage of the battery unit with the calibration voltage, so that the SOC of the battery unit is timely calibrated under the situation that the SOC calibration condition is met, to improve the accuracy of the SOC of the battery unit, avoid an SOC jump caused by a large difference between the SOC of the battery unit and the actual SOC at the tail end of charging or discharging, and effectively improve user experience.

BRIEF DESCRIPTION OF THE DRAWINGS

In order to illustrate technical solutions in embodiments of the present application or the conventional technology, the accompanying drawings used in the description of the embodiments or the conventional technology is briefly described below. It is apparent that the accompanying drawings in the following description are only for the embodiments of the present application. For those skilled in the art, other drawings can be obtained based on the provided accompanying drawings without creative efforts.

FIG. 1 is a schematic flowchart of a method for calibrating an SOC at a tail end of charging or discharging of an energy storage system according to an embodiment of the present application;

DETAILED DESCRIPTION OF EMBODIMENTS

Figure 2:
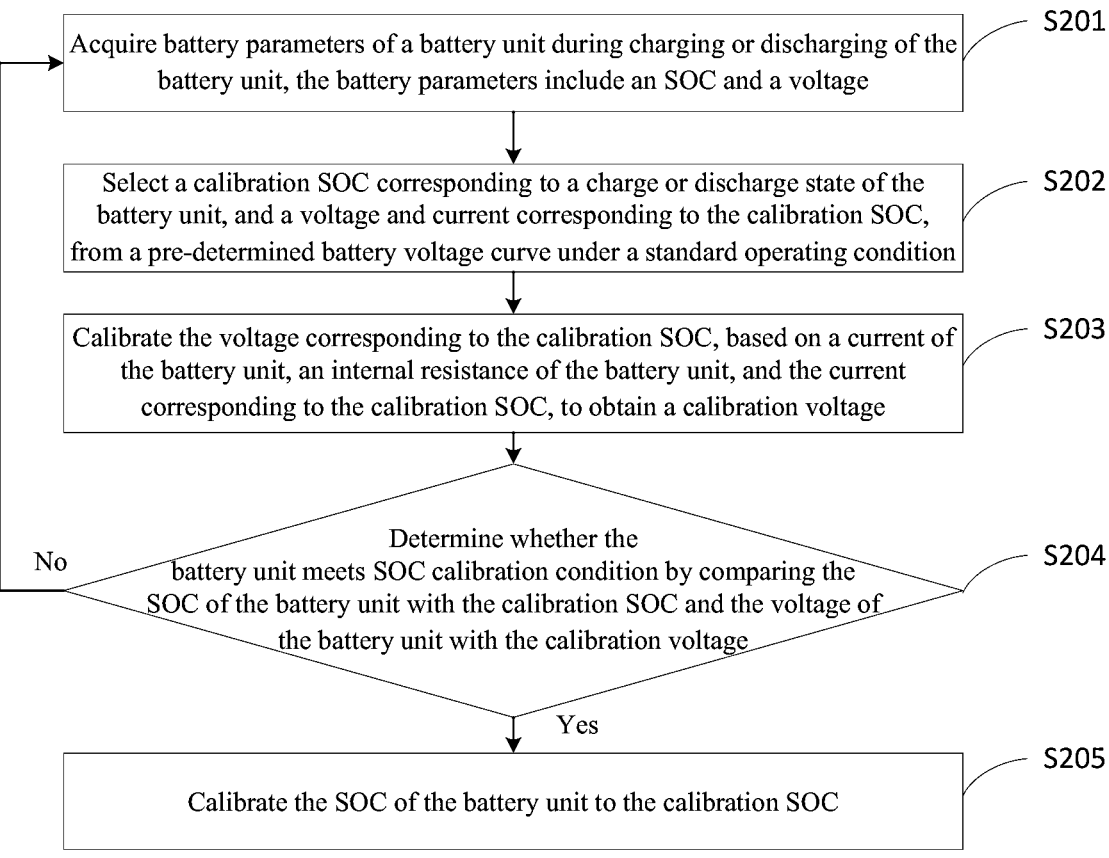
FIG. 2 is a schematic flowchart of another method for calibrating an SOC at a tail end of charging or discharging of an energy storage system according to an embodiment of the present application.

The technical solutions according to the embodiments of the present application are described below in conjunction with the accompanying drawings of the embodiments of the present application. Obviously, the described embodiments are only a part of the embodiments of the present application, not all of them. All other embodiments obtained by those skilled in the art based on the embodiments of the present application without creative efforts are within the protection scope of the present application.

Currently the SOC is usually estimated by combining the ampere-hour integration method and the open-circuit voltage method. The ampere-hour integration method relies on a given initial SOC, and the value of the initial SOC is prone to error. In addition, the SOC estimated by the ampere-hour integration method has certain error also due to current sampling errors and current accumulation errors. The open-circuit voltage refers to a terminal voltage of the battery measured when the battery reaches the electrochemical equilibrium state after being left standing for an enough time. The open-circuit voltage method refers to an estimation of the SOC of the battery by using a function relationship between the open-circuit voltage and the SOC of the battery. However, the function relationship is obtained based on a factory test environment under a rated working condition, which may be different from the actual working condition. Therefore, the SOC estimated by the open-circuit voltage method also has certain error, and the SOC is estimated after the battery is left standing for more than 2 hours to reach an internal electrochemical equilibrium. The error between the estimated SOC and the actual SOC becomes increasingly large especially at the tail end of charging or discharging of the energy storage system.

In order to solve the above technical problems, a method and a device for calibrating an SOC at a tail end of charging or discharging of an energy storage system are provided according to the present application, which are applied to a battery control unit in the energy storage system, and used to perform SOC calibration at the tail end of charging or discharging for a battery unit. The battery unit may be a single battery, a battery module/cluster (PACK), battery clusters (RACK), and so on, which is not specifically limited in the present application.

Referring to FIG. 1, a method for calibrating an SOC at a tail end of charging or discharging of an energy storage system is disclosed according to an embodiment. The method includes the following steps S101 to S104.

In step S101, battery parameters of a battery unit are acquired during charging or discharging of the battery unit, and the battery parameters include an SOC and a voltage.

The battery parameters may also include parameters such as a current and an internal resistance.

In step S102, a pre-calibrated calibration SOC at the tail end of charging or discharging and a calibration voltage are acquired.

At least one calibration SOC at a tail end of charging, such as 95%, is pre-calibrated during charging. At least one calibration SOC at a tail end of discharging, such as 5%, is pre-calibrated during discharging.

A battery voltage curve under a standard operating condition is pre-determined. The standard operating condition refers to a battery voltage curve under a standard rate and a specific temperature. The pre-calibrated calibration SOC at the tail end of charging or discharging and the calibration voltage are determined based on the pre-determined battery voltage curve under the standard operating condition.

If the actual operating condition of the battery unit is consistent with the standard operating condition, a voltage corresponding to the calibration SOC in the battery voltage curve under the standard operating condition may be determined as the calibration voltage. If the actual operating condition of the battery unit is not consistent with the standard operating condition, the voltage corresponding to the calibration SOC is required to be calibrated, and the calibrated voltage is determined as the calibration voltage, to improve calibration accuracy.

In step S103, whether the battery unit meets a SOC calibration condition is determined by comparing the SOC of the battery unit with the calibration SOC and comparing the voltage of the battery unit with the calibration voltage.

In general, the voltage and the SOC are positively correlated. A greater voltage leads to a greater SOC. If the voltage of the battery unit is greater than the calibration voltage, the SOC of the battery unit should be greater than the calibration SOC. In this way, the SOC is relatively accurate. On the contrary, if the voltage of the battery unit is greater than the calibration voltage, and the SOC of the battery unit is less than the calibration SOC, the SOC has an error. Therefore, the SOC of the battery unit is compared with the calibration SOC and the voltage of the battery unit is compared with the calibration voltage, and then whether the two comparison results are consistent is determined, so as to determine whether the battery unit meets the SOC calibration condition.

It should be noted that the SOC calibration condition to be met by the battery unit during charging may be different from the SOC calibration condition to be met by the battery unit during discharging.

If the battery unit meets the SOC calibration condition, S104 is executed to calibrate the SOC of the battery unit to the calibration SOC.

If the battery unit does not meet the SOC calibration condition, S101 is returned to and executed.

The method for calibrating an SOC at a tail end of charging or discharging of an energy storage system is disclosed according to the above embodiment. In the method, the SOC and the voltage of the battery unit are acquired in real time during charging or discharging of a battery unit. Whether the battery unit meets the SOC calibration condition is determined by comparing the SOC of the battery unit with the pre-calibrated calibration SOC at the tail end of charging or discharging and comparing the voltage of the battery unit and the calibration voltage, so that the SOC of the battery unit is timely calibrated if the SOC calibration condition is met, and the SOC calibration can be performed even if the battery unit is in a non-static state, thereby improving the accuracy of the SOC of the battery unit, avoiding an SOC jump caused by a large difference between the SOC of the battery unit and the actual SOC at the tail end of charging or discharging, and effectively improving user experience.

In addition, the method for calibrating an SOC at a tail end of charging or discharging of an energy storage system disclosed according to the embodiment does not require additional hardware and can be realized by optimizing algorithms on a commonly used battery management system (BMS) hardware platform in the conventional technology.

In one embodiment, the step S102 includes: selecting the calibration SOC corresponding to a charging or discharging state of the battery unit, and a voltage and a current that are corresponding to the calibration SOC, from a pre-determined battery voltage curve under a standard operating condition; and calibrating the voltage corresponding to the calibration SOC, based on a current of the battery unit, an internal resistance of the battery unit, and the current corresponding to the calibration SOC, to obtain the calibration voltage. Referring to FIG. 2, a method for calibrating SOC at a tail end of charging or discharging of an energy storage system according to the embodiment includes the following steps S201 to S205.

In step S201, battery parameters of a battery unit are acquired during charging or discharging of the battery unit, and the battery parameters include an SOC and a voltage.

In step S202, the calibration SOC corresponding to a charging or discharging state of the battery unit, and a voltage and a current that are corresponding to the calibration SOC are selected from a pre-determined battery voltage curve under a standard operating condition.

In step S203, the voltage corresponding to the calibration SOC is calibrated based on a current of the battery unit, an internal resistance of the battery unit, and the current corresponding to the calibration SOC, to obtain the calibration voltage.

Specifically, the voltage corresponding to the calibration SOC may be calibrated through the following function relationship:

$$V\_new\_chgcalib = f(V\_chgcalib, R, I)$$

In the function, V_new_chgcalib is the calibration voltage, V_chgcalib is the voltage corresponding to the calibration SOC, R is the internal resistance of the battery unit, and I is the current of the battery unit.

An optional implementation of the function is:

$$V\_new\_chgcalib = \Delta I * R + V\_chgcalib$$

In the function, $^\Delta I$ is a difference between the current of the battery unit and the current corresponding to the calibration SOC.

The above is only an optional way to calculate the calibration voltage, and the present application does not specifically limit the expression of the above function.

In step S204, whether the battery unit meets a SOC calibration condition is determined by comparing the SOC of the battery unit with the calibration SOC and comparing the voltage of the battery unit with the calibration voltage.

If the battery unit meets the SOC calibration condition, S205 is executed to calibrate the SOC of the battery unit to the calibration SOC.

If the battery unit does not meet the SOC calibration condition, S201 is returned to and executed.

In the method for calibrating an SOC at a tail end of charging or discharging of an energy storage system disclosed according to the embodiment, by calibrating the voltage corresponding to the calibration SOC, the accuracy of the calibration voltage is improved, and the influence of errors between the battery voltage curves under the actual operating condition and under the standard operating condition on subsequent determination of whether the battery unit meets the SOC calibration condition is avoided.

It can be understood that, during charging, the calibration SOC is a calibration SOC at the tail end of charging, and is generally set to a relatively large value, such as 95%. If the SOC of the battery unit is greater than the calibration SOC, no SOC jump occurs when the battery unit is fully charged. Therefore it is required to determine whether a calibration is needed only when the SOC of the battery unit is less than the calibration SOC. If the voltage of the battery unit is greater than the calibration voltage and the SOC of the battery unit is less than the calibration SOC, it indicates that the SOC of the battery unit has an error and is required to be calibrated.

Figure 3:
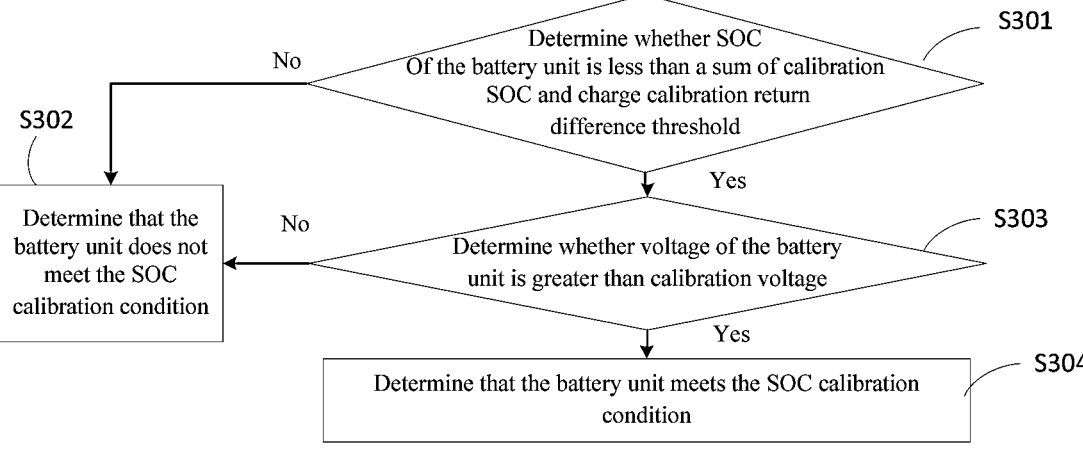
FIG. 3 is a schematic flowchart of some steps of a method for calibrating an SOC at a tail end of charging or discharging of an energy storage system according to an embodiment of the present application.

Referring to FIG. 3, during charging an optional implementation of step S103 is as the following steps S301 to S304.

In step S301, whether the SOC of the battery unit is less than a sum of the calibration SOC and a charge calibration return difference threshold is determined.

It should be noted that the charge calibration return difference threshold is a negative value. The SOC of the battery unit being less than the sum of the calibration SOC and the charge calibration return difference threshold indicates that the SOC of the battery unit is less than the calibration SOC and has a certain difference from the calibration SOC.

If the SOC of the battery unit is not less than the sum of the calibration SOC and the charge calibration return difference threshold, S302 is executed to determine that the battery unit does not meet the SOC calibration condition.

If the SOC of the battery unit is less than the sum of the calibration SOC and the charge calibration return difference threshold, S303 is executed to determine that whether the voltage of the battery unit is greater than the calibration voltage.

If the voltage of the battery unit is not greater than the calibration voltage, S302 is executed to determine that the battery unit does not meet the SOC calibration condition.

If the voltage of the battery unit is greater than the calibration voltage, S304 is executed to determine that the battery unit meets the SOC calibration condition.

In general, if the voltage of the battery unit is greater than the calibration voltage, the SOC of the battery unit should also be greater than the calibration SOC. If the voltage of the battery unit is greater than the calibration voltage, and the SOC of the battery unit is less than the calibration SOC and has a certain difference from the calibration SOC, it indicates that the SOC has an error at this time. In the embodiment, whether the battery unit meets the SOC calibration condition can be accurately determined by comparing the SOC of the battery unit with the calibration SOC and comparing the voltage of the battery unit with the calibration voltage.

In a case that the battery unit includes multiple cells, the cell with a highest voltage first reaches a full charge state during charging. In order to avoid overcharge, preferably, the voltage of the battery unit is the highest voltage of the cells in the battery unit during charging of the battery unit.

It can be understood that, during discharging the calibration SOC is a calibration SOC at the tail end of discharging, and is generally set to a relatively small value, such as 5%. If the SOC of the battery unit is less than the calibration SOC, no SOC jump occurs when the battery unit is fully discharged. It is required to determine whether a calibration is needed only when the SOC of the battery unit is greater than the calibration SOC. If the voltage of the battery unit is less than the calibration voltage and the SOC of the battery unit is greater than the calibration SOC, it indicates that the SOC of the battery unit has an error and is required to be calibrated.

Figure 4:
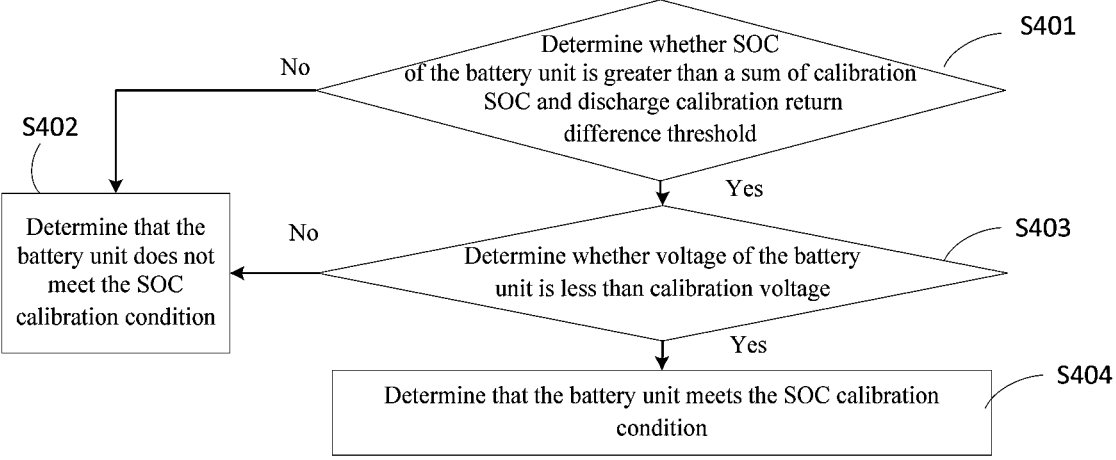
FIG. 4 is a schematic flowchart of some steps of a method for calibrating an SOC at a tail end of charging or discharging of an energy storage system according to an embodiment of the present application.

Referring to FIG. 4, during discharging an optional implementation of step S103 is as the following steps S401 to S404.

In step S401, whether the SOC of the battery unit is greater than a sum of the calibration SOC and a discharge calibration return difference threshold is determined.

It should be noted that the discharge calibration return difference threshold is a positive value. The SOC of the battery unit being greater than the sum of the calibration SOC and the charge calibration return difference threshold indicates that the SOC of the battery unit is greater than the calibration SOC and has a certain difference from the calibration SOC.

If the SOC of the battery unit is not greater than the sum of the calibration SOC and the discharge calibration return difference threshold, S402 is executed to determine that the battery unit does not meet the SOC calibration condition.

If the SOC of the battery unit is greater than the sum of the calibration SOC and the discharge calibration return difference threshold, S403 is executed to determine whether the voltage of the battery unit is less than the calibration voltage.

If the voltage of the battery unit is not less than the calibration voltage, S402 is executed to determine that the battery unit does not meet the SOC calibration condition.

If the voltage of the battery unit is less than the calibration voltage, S404 is executed to determine that the battery unit meets the SOC calibration condition.

In a case that the battery unit includes multiple cells, the cell with a lowest voltage first reaches a full discharge state in the discharge state. In order to avoid over discharge of the battery, preferably, the voltage of the battery unit is the lowest voltage of the cells in the battery unit during discharging of the battery unit.

Furthermore, in some application scenarios, such as in a scenario that the accuracy of the SOC is abnormal due to a long-term operation of a large-scale energy storage system, the SOC calibration may be performed when a depth of charge (DOD) is about 90% or a depth of discharge is about 90%. That is, the calibration SOC at the tail end of charging may be set to 90%, and the calibration SOC at the tail end of discharging may be set to 10%. That is to say, the calibration SOC may be flexibly calibrated in advance according to different application scenarios.

In addition, multiple calibration SOCs may be calibrated at the tail end of charging and the tail end of discharging, for example, 90% and 95% are set as the calibration SOCs at the tail end of charging, and 10% and 5% are set as the calibration SOCs at the tail end of discharging, thereby achieving SOC classification calibration and further improving the accuracy of the SOC.

Figure 5:
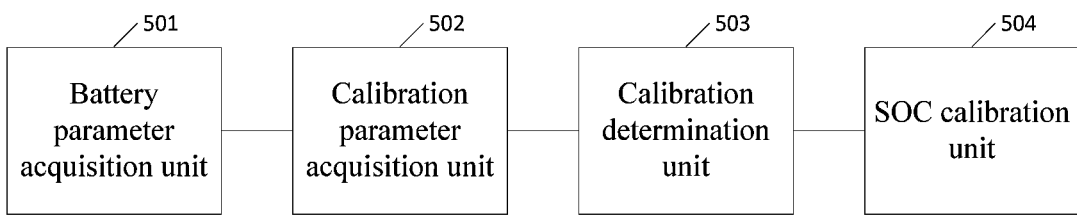
FIG. 5 is a structural schematic diagram of a device for calibrating an SOC at a tail end of charging or discharging of an energy storage system according to an embodiment of the present application.

A device for calibrating a SOC at a tail end of charging or discharging of an energy storage system is provided according to an embodiment of the present disclosure. The device may refer to the above method for calibrating a SOC at a tail end of charging or discharging of an energy storage system. Referring to FIG. 5, the device includes:

a battery parameter acquisition unit 501, configured to acquire battery parameters of a battery unit during charging or discharging of the battery unit, wherein the battery parameters comprise an SOC and a voltage;

a calibration parameter acquisition unit 502, configured to acquire a pre-calibrated calibration SOC at the tail end of charging or discharging and a calibration voltage;

a calibration determination unit 503, configured to determine whether the battery unit meets an SOC calibration condition by comparing the SOC of the battery unit with the calibration SOC and comparing the voltage of the battery unit with the calibration voltage; and an SOC calibration unit 504, configured to calibrate the SOC of the battery unit to the calibration SOC in responding to determining that the battery unit meets the SOC calibration condition.

In an embodiment, the calibration parameter acquisition unit 502 is configured to:

select the calibration SOC corresponding to a charging or discharging state of the battery unit, and a voltage and a current that are corresponding to the calibration SOC, from a pre-determined battery voltage curve under a standard operating condition; and calibrate the voltage corresponding to the calibration SOC based on a current of the battery unit, an internal resistance of the battery unit, and the current corresponding to the calibration SOC, to obtain the calibration voltage.

In an embodiment, during charging of the battery unit, the calibration determination unit 503 is configured to:

determine whether the SOC of the battery unit is less than a sum of the calibration SOC and a charge calibration return difference threshold, wherein the charge calibration return difference threshold is a negative value;

determine that the battery unit does not meet the SOC calibration condition, in response to the SOC of the battery unit being not less than the sum of the calibration SOC and the charge calibration return difference threshold;

determine whether the voltage of the battery unit is greater than the calibration voltage, in response to the SOC of the battery unit being less than the sum of the calibration SOC and the charge calibration return difference threshold;

determine that the battery unit does not meet the SOC calibration condition, in response to the voltage of the battery unit being not greater than the calibration voltage;

determine that the battery unit meets the SOC calibration condition, in response to the voltage of the battery unit being greater than the calibration voltage.

In an embodiment, the voltage of the battery unit is a highest voltage of voltages of cells in the battery unit during charging of the battery unit.

In an embodiment, during discharging of the battery unit, the calibration determination unit 503 is configured to:

determine whether the SOC of the battery unit is greater than a sum of the calibration SOC and a discharge calibration return difference threshold, wherein the discharge calibration return difference threshold is a positive value;

determine that the battery unit does not meet the SOC calibration condition, in response to the SOC of the battery unit being not greater than the sum of the calibration SOC and the discharge calibration return difference threshold;

determine whether the voltage of the battery unit is less than the calibration voltage, in response to the SOC of the battery unit being greater than the sum of the calibration SOC and the discharge calibration return difference threshold;

determine that the battery unit does not meet the SOC calibration condition, in response to the voltage of the battery unit being not less than the calibration voltage;

determine that the battery unit meets the SOC calibration condition, in response to the voltage of the battery unit being less than the calibration voltage.

In an embodiment, the voltage of the battery unit is a lowest voltage of voltages of cells in the battery unit during discharging of the battery unit.

For the device for calibrating a SOC at a tail end of charging or discharging of an energy storage system, the SOC and the voltage of the battery unit are acquired in real time during charging/discharge of a battery unit. Whether the battery unit meets the SOC calibration condition is determined by comparing the SOC of the battery unit with the pre-calibrated calibration SOC at the tail end of charging or discharging and comparing the voltage of the battery unit with the calibration voltage, so that the SOC of the battery unit is timely calibrated if the SOC calibration condition is met, thereby improving the accuracy of the SOC of the battery unit, avoiding a SOC jump caused by a large difference between the SOC of the battery unit and the actual SOC of the battery unit at the tail end of charging or discharging, and effectively improving user experience.

In the description, the embodiments are described in a progressive manner, and focus on the differences from other embodiments. For same and similar parts of the various embodiments, reference may be made to each other. For the device disclosed by the embodiment, since the device corresponds to the method disclosed by the embodiment, the description is relatively simple. For the related part, reference may be made to the description of the method.

It should be noted that, relational terms such as "first" and "second" in the description are only used to distinguish one entity or operation from another entity or operation, and do not necessarily require or imply that any actual relationship or order exists between the entities or operations. Moreover, terms such as "comprise", "include", or any other variation thereof are intended to cover non-exclusive inclusion, such that a process, method, article or device that includes a series of elements not only includes the series of elements, but also includes other elements not explicitly listed, or also includes elements inherent in the process, method, article or device. Without further limitations, an element defined by a statement "comprise a . . . " does not exclude the existence of other identical element in the process, method, article or device that includes the element.

The steps of the method or algorithms described in combination with the embodiments disclosed herein may be directly implemented by hardware, a software module executed by a processor, or a combination of both. The software module may be placed in random access memory (RAM), internal storage, read-only memory (ROM), electrically-programmable ROM, electrically erasable programmable ROM, register, hard disk, removable disk, CD-ROM, or any other storage medium known in the conventional technology.

The above embodiments may be combined arbitrarily. For the above description of the embodiments, features described in the embodiments of the description may be replaced or combined with each other, so that those skilled in the art can implement or use the present application.

The above description of the embodiments enables those skilled in the art to implement or use the present application. Various modifications to the embodiments are apparent to those skilled in the art. The general principles defined herein may be implemented in other embodiments without departing from the spirit or scope of the present application. Therefore, the present application is not limited to the embodiments shown herein, and shall conform to the widest scope consistent with the principles and novel features disclosed herein.

The invention claimed is:

1. A method for calibrating a State of Charge (SOC) at a tail end of charging or discharging of an energy storage system, comprising:

acquiring battery parameters of a battery unit during charging or discharging of the battery unit, wherein the battery parameters comprise an SOC and a voltage;

acquiring a pre-calibrated calibration SOC at the tail end of charging or discharging and a corresponding calibration voltage;

determining whether the battery unit meets an SOC calibration condition, by comparing the SOC of the battery unit with the calibration SOC and comparing the voltage of the battery unit with the calibration voltage; and calibrating the SOC of the battery unit to the calibration SOC, in responding to determining that the battery unit meets the SOC calibration condition, wherein the determining whether the battery unit meets an SOC calibration condition comprises: determining that the battery unit meets the SOC calibration condition during charging of the battery unit, in response to the SOC of the battery unit being less than the calibration SOC and the voltage of the battery unit being greater than the calibration voltage.

2. The method according to claim 1, wherein acquiring the pre-calibrated calibration SOC at the tail end of charging or discharging and the calibration voltage comprises:

selecting the calibration SOC corresponding to a charging state or a discharging state of the battery unit, and a voltage and a current that are corresponding to the calibration SOC, from a pre-determined battery voltage curve under a standard operating condition; and calibrating the voltage corresponding to the calibration SOC, based on a current of the battery unit, an internal resistance of the battery unit, and the current corresponding to the calibration SOC, to obtain the calibration voltage.

3. The method according to claim 1, wherein determining whether the battery unit meets the SOC calibration condition during charging of the battery unit comprises:

determining whether the SOC of the battery unit is less than a sum of the calibration SOC and a charge calibration return difference threshold, wherein the charge calibration return difference threshold is a negative value;

determining that the battery unit does not meet the SOC calibration condition, in response to the SOC of the battery unit being not less than the sum of the calibration SOC and the charge calibration return difference threshold;

determining whether the voltage of the battery unit is greater than the calibration voltage, in response to the SOC of the battery unit being less than the sum of the calibration SOC and the charge calibration return difference threshold;

determining that the battery unit does not meet the SOC calibration condition, in response to the voltage of the battery unit being not greater than the calibration voltage;

determining that the battery unit meets the SOC calibration condition, in response to the voltage of the battery unit being greater than the calibration voltage.

4. The method according to claim 3, wherein the voltage of the battery unit is a highest voltage of voltages of cells in the battery unit during charging of the battery unit.

5. The method according to claim 1, wherein determining whether the battery unit meets the SOC calibration condition during discharging of the battery unit comprises:

determining whether the SOC of the battery unit is greater than a sum of the calibration SOC and a discharge calibration return difference threshold, wherein the discharge calibration return difference threshold is a positive value;

determining that the battery unit does not meet the SOC calibration condition, in response to the SOC of the battery unit being not greater than the sum of the calibration SOC and the discharge calibration return difference threshold;

determining whether the voltage of the battery unit is less than the calibration voltage, in response to the SOC of the battery unit being greater than the sum of the calibration SOC and the discharge calibration return difference threshold;

determining that the battery unit does not meet the SOC calibration condition, in response to the voltage of the battery unit being not less than the calibration voltage;

determining that the battery unit meets the SOC calibration condition, in response to the voltage of the battery unit being less than the calibration voltage.

6. The method according to claim 5, wherein the voltage of the battery unit is a lowest voltage of voltages of cells in the battery unit during discharging of the battery unit.

7. A device for calibrating a State of Charge (SOC) at a tail end of charging or discharging of an energy storage system, comprising:

one or more processors; and a memory, the memory storing computer-readable instructions, and the computer-readable instructions, when executed by the one or more processors, causing the one or more processors to:

acquire battery parameters of a battery unit during charging or discharging of the battery unit, wherein the battery parameters comprise an SOC and a voltage;

acquire a pre-calibrated calibration SOC at the tail end of charging or discharging and a corresponding calibration voltage;

determine whether the battery unit meets an SOC calibration condition by comparing the SOC of the battery unit with the calibration SOC and comparing the voltage of the battery unit with the calibration voltage; and calibrate the SOC of the battery unit to the calibration SOC in responding to determining that the battery unit meets the SOC calibration condition, wherein during charging of the battery unit, the computer-readable instructions further cause the one or more processors to: determine that the battery unit meets the SOC calibration condition, in response to the SOC of the battery unit being less than the calibration SOC and the voltage of the battery unit being greater than the calibration voltage.

8. The device according to claim 7, wherein the computer-readable instructions further cause the one or more processors to:

select the calibration SOC corresponding to a charging state or a discharging state of the battery unit, and a voltage and a current that are corresponding to the calibration SOC, from a pre-determined battery voltage curve under a standard operating condition; and calibrate the voltage corresponding to the calibration SOC based on a current of the battery unit, an internal resistance of the battery unit, and the current corresponding to the calibration SOC, to obtain the calibration voltage.

9. The device according to claim 7, wherein during charging of the battery unit, the computer-readable instructions further cause the one or more processors to:

determine whether the SOC of the battery unit is less than a sum of the calibration SOC and a charge calibration return difference threshold, wherein the charge calibration return difference threshold is a negative value;

determine that the battery unit does not meet the SOC calibration condition, in response to the SOC of the battery unit being not less than the sum of the calibration SOC and the charge calibration return difference threshold;

determine whether the voltage of the battery unit is greater than the calibration voltage, in response to the SOC of the battery unit being less than the sum of the calibration SOC and the charge calibration return difference threshold;

determine that the battery unit does not meet the SOC calibration condition, in response to the voltage of the battery unit being not greater than the calibration voltage;

determine that the battery unit meets the SOC calibration condition, in response to the voltage of the battery unit being greater than the calibration voltage.

10. The device according to claim 9, wherein the voltage of the battery unit is a highest voltage of voltages of cells in the battery unit during charging of the battery unit.

11. The device according to claim 7, wherein during discharging of the battery unit, the computer-readable instructions further cause the one or more processors to:

determine whether the SOC of the battery unit is greater than a sum of the calibration SOC and a discharge calibration return difference threshold, wherein the discharge calibration return difference threshold is a positive value;

determine that the battery unit does not meet the SOC calibration condition, in response to the SOC of the battery unit being not greater than the sum of the calibration SOC and the discharge calibration return difference threshold;

determine whether the voltage of the battery unit is less than the calibration voltage, in response to the SOC of the battery unit being greater than the sum of the calibration SOC and the discharge calibration return difference threshold;

determine that the battery unit does not meet the SOC calibration condition, in response to the voltage of the battery unit being not less than the calibration voltage;

determine that the battery unit meets the SOC calibration condition, in response to the voltage of the battery unit being less than the calibration voltage.

12. The device according to claim 11, wherein the voltage of the battery unit is a lowest voltage of voltages of cells in the battery unit during discharging of the battery unit.

* * * * *